(12) United States Patent
Bitterlich et al.

(10) Patent No.: US 7,230,978 B2
(45) Date of Patent: Jun. 12, 2007

(54) CHANNEL CODEC PROCESSOR CONFIGURABLE FOR MULTIPLE WIRELESS COMMUNICATIONS STANDARDS

(75) Inventors: Stefan Johannes Bitterlich, Aachen (DE); David Morris Holmes, Cupertino, CA (US)

(73) Assignee: Infineon Technologies AG, Munich (DE)

( * ) Notice: Subject to any disclaimer, the term of this patent is extended or adjusted under 35 U.S.C. 154(b) by 933 days.

(21) Appl. No.: 10/040,727

(22) Filed: Dec. 28, 2001

(65) Prior Publication Data

US 2002/0119803 A1    Aug. 29, 2002

Related U.S. Application Data

(60) Provisional application No. 60/258,865, filed on Dec. 29, 2000.

(51) Int. Cl.
 *H04B 1/38* (2006.01)
 *H04L 5/16* (2006.01)

(52) U.S. Cl. .................. 375/219; 375/220; 375/222

(58) Field of Classification Search ................ 375/219, 375/220, 222, 262, 265, 341; 713/320
 See application file for complete search history.

(56) References Cited

U.S. PATENT DOCUMENTS

| | | | |
|---|---|---|---|
| 5,181,209 A | 1/1993 | Hagenauer et al. |
| 5,406,570 A | 4/1995 | Berrou et al. |
| 5,446,747 A | 8/1995 | Berrou |
| 5,485,486 A | 1/1996 | Gilhousen et al. |
| 5,513,176 A | 4/1996 | Dean et al. |
| 5,519,761 A | 5/1996 | Gilhousen |
| 5,533,011 A | 7/1996 | Dean et al. |
| 5,537,444 A | 7/1996 | Nill et al. |
| 5,559,865 A | 9/1996 | Gilhousen |
| 5,563,897 A | 10/1996 | Pyndiah et al. |
| 5,594,718 A | 1/1997 | Weaver, Jr. et al. |
| 5,603,096 A | 2/1997 | Gilhousen et al. |
| 5,621,752 A | 4/1997 | Antonio et al. |
| 5,625,876 A | 4/1997 | Gilhousen et al. |
| 5,657,420 A | 8/1997 | Jacobs et al. |
| 5,680,395 A | 10/1997 | Weaver et al. |
| 5,691,974 A | 11/1997 | Zehavi et al. |
| 5,697,055 A | 12/1997 | Gilhousen et al. |
| 5,715,236 A | 2/1998 | Gilhousen et al. |
| 5,721,745 A | 2/1998 | Hladik et al. |

(Continued)

OTHER PUBLICATIONS

Arrigo et al., "Adaptive FEC on a Reconfigurable Processor for Wireless Multimedia Communications, Circuits and Systems". ISCAS '98. Proceedings of the *1998 IEEE International Symposium*, vol. 4, pp. 417-420.

(Continued)

*Primary Examiner*—Phuong Phu
(74) *Attorney, Agent, or Firm*—Dickstein Shapiro LLP

(57) ABSTRACT

A reconfigurable channel CODEC (encoder and decoder) processor for a wireless communication system is disclosed. A high degree of user programmability and reconfigurability is provided by the channel CODEC processor. In particular, the reconfigurable channel CODEC processor includes processor cores and algorithm-specific kernels that contain logic circuits tailored for carrying out predetermined but user-configurable decoding and encoding algorithms. The interconnects between the processor cores and the algorithm-specific kernels are also user-configurable. Thus, the same hardware can be reconfigured for many different wireless communication standards.

37 Claims, 11 Drawing Sheets

U.S. PATENT DOCUMENTS

| | | |
|---|---|---|
| 5,721,746 A | 2/1998 | Hladik et al. |
| 5,729,560 A | 3/1998 | Hagenauer et al. |
| 5,734,962 A | 3/1998 | Hladik et al. |
| 5,748,650 A | 5/1998 | Blaker et al. |
| 5,751,761 A | 5/1998 | Gilhousen |
| 5,761,248 A | 6/1998 | Hagenauer et al. |
| 5,778,338 A | 7/1998 | Jacobs et al. |
| 5,812,938 A | 9/1998 | Gilhousen et al. |
| 5,822,318 A | 10/1998 | Tiedemann, Jr. et al. |
| 5,841,806 A | 11/1998 | Gilhousen et al. |
| 5,848,063 A | 12/1998 | Weaver, Jr. et al. |
| 5,859,612 A | 1/1999 | Gilhousen |
| 5,864,760 A | 1/1999 | Gilhousen et al. |
| 5,905,900 A * | 5/1999 | Combs et al. ............. 713/320 |
| 5,917,812 A | 6/1999 | Antonio et al. |
| 5,933,787 A | 8/1999 | Gilhousen et al. |
| 5,943,361 A | 8/1999 | Gilhousen et al. |
| 5,970,413 A | 10/1999 | Gilhousen |
| 6,014,411 A | 1/2000 | Wang |
| 6,081,229 A | 6/2000 | Soliman et al. |
| 6,085,349 A | 7/2000 | Stein |
| 6,111,865 A | 8/2000 | Butler et al. |
| 6,141,781 A | 10/2000 | Mueller |
| 6,157,668 A | 12/2000 | Gilhousen et al. |
| 6,185,246 B1 | 2/2001 | Gilhousen |
| 6,205,190 B1 | 3/2001 | Antonio et al. |
| 6,239,748 B1 | 5/2001 | Gilhousen |
| 6,304,612 B1 | 10/2001 | Baggen et al. |
| 6,353,640 B1 * | 3/2002 | Hessel et al. ............... 375/262 |
| 6,381,457 B1 | 4/2002 | Carlsson et al. |
| 6,434,203 B1 * | 8/2002 | Halter ....................... 375/341 |
| 2001/0008837 A1 | 7/2001 | Takahashi |
| 2001/0009850 A1 | 7/2001 | Kushige |
| 2001/0013854 A1 | 8/2001 | Ogoro |
| 2001/0018735 A1 | 8/2001 | Murakami et al. |
| 2001/0022787 A1 | 9/2001 | Mchale |
| 2001/0023395 A1 | 9/2001 | Su et al. |
| 2001/0024173 A1 | 9/2001 | Katz |
| 2001/0024433 A1 | 9/2001 | Vanttinen |
| 2001/0025242 A1 | 9/2001 | Joncour |
| 2001/0027544 A1 | 10/2001 | Joncour |
| 2001/0038663 A1 | 11/2001 | Medlock |
| 2001/0041536 A1 | 11/2001 | Hasegawa |
| 2001/0046211 A1 | 11/2001 | Maruwaka et al. |
| 2001/0047427 A1 | 11/2001 | Lansio et al. |
| 2001/0048713 A1 | 12/2001 | Medlock et al. |
| 2001/0051506 A1 | 12/2001 | Riikonen |
| 2002/0015401 A1 * | 2/2002 | Subramanian et al. ...... 370/347 |
| 2002/0031166 A1 * | 3/2002 | Subramanian et al. ...... 375/130 |

OTHER PUBLICATIONS

Halter et al., "Reconfigurable Signal Processor for Channel Coding & Decoding in Low SNR Wireless Communications", *IEEE Workshop on Signal Processing Systems 1998*, Oct. 8-10, 1998, pp. 260-274, especially pp. 260-262 and 266-273.

Phillips, L., et al.; "A Baseband IC for 3G UMTS Communications"; Proc. of Vehicular Technology Conference, Amsterdam, Netherlands, vol. 3, Sep. 19, 1999, pp. 1521-1524.

Verbauwhede, Ingrid, et al.; "Low Power DSP's for Wireless Communications"; Proc. of International Symposium on Low Power Electronics and Design Islped, Rapallo, Italy, Jul. 26, 2000, pp. 303-310.

Weinsziehr, Dirk, et al.; "KISS-16V2: A One-Chip ASIC DSP Solution for GSM": IEEE Journal of Solid-State Circuits, vol. 27, No. 7, Jul. 1992, pp. 1057-1065.

Telecommunications and Mission Operations Directorate—DSN Technology Program,"*Communications System Analysis: Turbo Codes.*" http://www331.jpl.nasa.gov/public/TurboForce.GIF; Date Accessed: Dec. 27, 2001; pp. 1.

* cited by examiner

CHANNEL CODEC PROCESSOR CONFIGURABLE FOR MULTIPLE WIRELESS COMMUNICATIONS STANDARDS

The present application claims priority under 35 U.S.C. § 119(e) to U.S. Provisional Patent Application filed Dec. 29, 2000, bearing Ser. No. 60/258,865.

BACKGROUND OF THE INVENTION

The present invention relates generally to the field of wireless communication. In particular, the present claimed invention relates to a processor for performing coding and decoding operations in a wireless communication system.

Wireless communication has extensive applications in consumer and business markets. Among the many communication system applications are: fixed wireless, unlicensed (FCC) wireless, local area network (LAN), cordless telephony, personal base station, telemetry, mobile wireless, encryption, and other digital data processing applications. These wireless applications utilize different and usually incompatible protocols. Consequently, each application may require specialized hardware, software, and methodology. This is especially true for channel CODECs (encoders and decoders) because different communication standards typically utilize different channel coding and decoding algorithms. ASIC (Application Specific Integrated Circuit) solutions, which can be costly in terms of design, testing, manufacturing, and infrastructure resources, are inflexible and are therefore unsuitable for the changing wireless communication standards. DSP (Digital Signal Processor) solutions, while offering the advantage of flexibility, have other limitations. For instance, many DSPs are not powerful enough to handle the high data rate requirements of the more advanced wireless communication standards.

Accordingly, a need arises to overcome the limitations associated with the varied hardware, software, and methodology of encoding and decoding digital signals in each of the varied wireless applications.

SUMMARY OF THE DISCLOSURE

An embodiment of the present invention is a reconfigurable channel CODEC (encoder and decoder) processor for a wireless communication system. A high degree of user programmability and reconfigurability is provided by the channel CODEC processor such that the same hardware can be adapted for a wide range of wireless communication standards such as but not limited to 3GPP, cdma2000, IS-95, etc., and other present and future generations of communication protocols and standards. The channel CODEC processor includes a set of microprogrammed processor cores that are augmented with algorithm-specific kernels. The algorithm-specific kernels include logic tailored for carrying out computationally intensive operations that are used in encoding and decoding algorithms (CODEC algorithms) of many wireless communication standards. Because computationally intensive operations are executed by the algorithm-specific kernels, rather than by the processor cores themselves, the processor cores can operate at a relatively low clock rate. As a result, power consumption can be significantly reduced without compromising performance. Alternatively, a much higher data throughput can be achieved or a significantly higher number of channels can be encoded/decoded using the same die area.

In one embodiment, the processor cores and the algorithm-specific kernels are user-configurable. User-defined microprograms can be loaded into the processors. These user-defined microprograms dictate where and how a certain channel encoding/decoding operation (channel CODEC operation) is performed. In one embodiment, the microprograms dictate a whether a certain CODEC operation is executed by a single processor cores or by multiple processor cores. Furthermore, the microprograms dictate whether a certain CODEC operation is carried out by a processor core alone, partially by a processor core and partially by an algorithm-specific kernel, or by an algorithm-specific kernel alone. This programmability enables the channel CODEC processor to be easily adapted to different wireless communication standards. Microprogram memories, which store instructions for the processor cores, are writeable via a scan-chain. In other embodiments, the microprogram memories are writeable via a processor interface.

According to one embodiment, the algorithm-specific kernels are reconfigurable and reprogrammable. The processor cores, or other logic in the channel CODEC processor, provide configuration data for the algorithm-specific kernels at start up (initialization). The kernels may also be dynamically reconfigured "on-the-fly" by the processor cores. That is, upon detecting a certain coding/decoding requirement for an incoming data stream, the processor cores can dynamically alter the configuration of the algorithm-specific kernels to meet the needs of the data stream.

In one aspect of the present invention, individual data stream processor cores control and exchange data with multiple kernels. In this way, a very high degree of programmability and reconfigurability can be achieved. Furthermore, kernels that consume large die areas, such as Turbo decoders and Viterbi decoders, need not be implemented for each individual data-stream processor core, but may be shared by the entire set of data-stream processor cores of the channel CODEC processor.

According to another aspect of the present invention, the architecture of the CODEC processor is modular and is easily scalable to the throughput requirements of the wireless communication system in which it is used. For communication standards that require a larger number of channels to be supported, a larger number of instantiations of the processor cores and kernels may be used on the host communication device without otherwise requiring substantial redesign.

According to yet another aspect of the present invention, computational resources can be reconfigured by the users for encoding/decoding a large number of low-rate channels, a small number of high-rate channels or combinations of low-rate, medium rate and high-rate channels. This allows the user to program the channel CODEC processor for different wireless standards and to add customized functionality for product differentiation and for adaptation to different markets.

BRIEF DESCRIPTION OF THE DRAWINGS

The drawings included herewith are incorporated in and form a part of this specification. The drawings illustrate embodiments of the invention and, together with the description, serve to explain the principles of the invention. It should be understood that the drawings referred to in this description are not drawn to scale unless specifically noted as such.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it is understood that they are not intended to limit the invention to these embodiments. Rather, the invention is intended to cover alternatives, modifications and equivalents, which may be included within the spirit and scope of the invention. Additionally, in the following description, numerous specific details are set forth in order to provide a thorough understanding of the present invention. However, it will be apparent to one of ordinary skill in the art that the present invention may be practiced without these specific details. In other instances, well-known methods, procedures, components, and circuits have not been described in detail so as not to unnecessarily obscure aspects of the present invention. Furthermore, while the present invention may be implemented in a digital wireless communication system in the present embodiment, the present invention is well suited to other applications.

Communication Device

Figure 1:
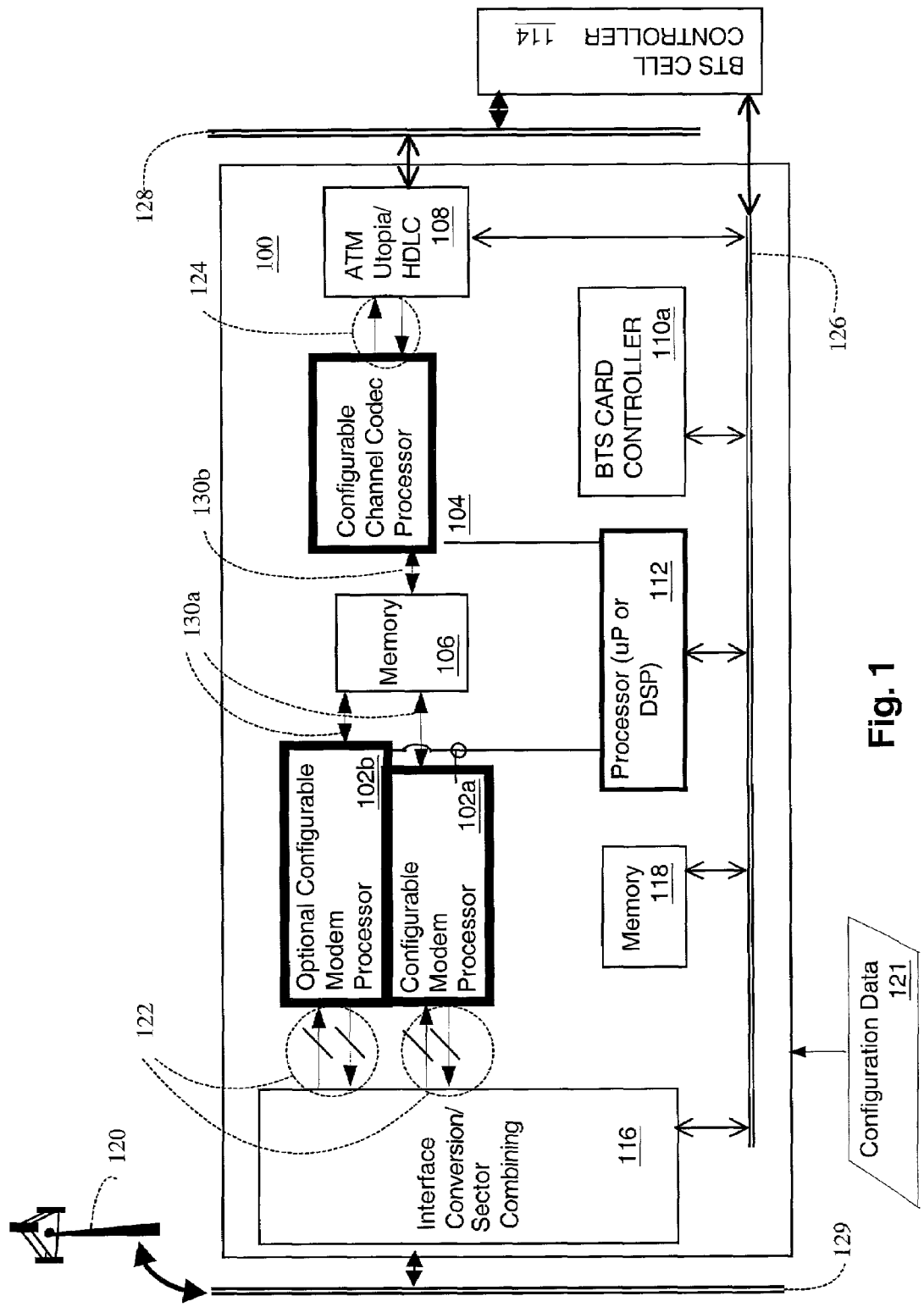
FIG. 1 is a block diagram of an electronic communication device having heterogeneous multiprocessor components, in accordance with one embodiment of the present invention.

FIG. 1 is a block diagram of an electronic communication device 100 in accordance with an embodiment of the present invention. The communication device 100 is responsible for performing the data processing steps needed to convert a received signal into meaningful data for an end user and to convert an input from a user to a signal suitable for wireless transmission. The components of the communication device 100 perform a wide variety of functions to meet the requirements of the specific communication protocol used by the communication device.

As shown in FIG. 1, the communication device 100 includes an interface conversion block 116, a modulator/demodulator (modem) processor 102a, an optional configurable modem processor 102b, memories 106 and 118, a processor 112, a configurable channel coder/decoder (CODEC) processor 104, a base transceiver station (BTS) card controller 100a, and an ATM Utopia/HDLC 108. Interface conversion block 116 is coupled to the antenna bus 129, which is in turn coupled to an antenna 120. Interface conversion block 116 is also coupled to configurable modem processor 102a and to optional configurable modem processor 102b via bus 122, respectively. Bus 122 can be separate independent non-shared buses, or a single shared bus. Interface conversion block 116 includes components (not shown) such as a radio frequency (RF) transceiver and an analog to digital (ND) converter coupled to each other in series, whose subcomponents and functions are known to those skilled in the art. Configurable modem processors 102a-102b and configurable channel CODEC processor 104 are coupled to the processor 112 and to memory 106, which is random access memory (RAM) in the present embodiment. The channel CODEC processor 104 is also coupled to ATM Utopia/HDLC 108 via bus 124. An internal data/control bus 126 is coupled to interface conversion block 116, memory 118, processor 112, BTS card controller 110a, and to ATM Utopia/HDLC 108 in order to pass data and control instructions between these components. ATM Utopia/HDLC 108 is a conventional asynchronous transfer mode (ATM) networking interface. Also shown is an external BTS cell controller 114 that is coupled to internal bus 126 and to a mobile telephone switching office bus 128. A similar communication device that is suitable for spread spectrum communication is described in co-pending United States Patent Application entitled "A Wireless Spread Spectrum Communication Platform Using Dynamically Reconfigurable Logic," filed Jan. 29, 2001, bearing Ser. No. 09/772,584 and, the disclosure of which is hereby incorporated by reference in its entirety.

In furtherance of the present invention, channel coding and decoding functions of the device 100 are carried out by the channel CODEC processor 104, which is preferably a multi-channel digital channel encoder-decoder chip that performs convolution, iterative Turbo decoding, rate-detection, and rate matching functions for a wide range of quantities of voice and data channels. Other functions that can be carried out by channel CODEC processor 104 for transmission encoding include convolutional coding and turbo coding functions, puncturing, rate-matching, and interleaving on the transmit path. Other channel CODEC processes, which are disclosed and defined by 3GPP, cdma2000 and other wireless communication standards, can be performed also by the channel CODEC processor 104. The channel CODEC processor 104 is user-configurable. That is, the functionality of the channel CODEC processor 104 can be programmed and re-programmed by the users according to the requirements of different communication standards. The programmability of the channel CODEC processor 104 enables the processor to implement the channel CODEC functionality of a wide range of wireless communication standards. More specific information of the channel CODEC functions can be obtained from various international standards organizations, such as the International Telecommunication Union (ITU). The channel coding specification of 3GPP, for instance, can be obtained from the World Wide Web at the URL address: www.3gpp.org.

According to one embodiment of the invention, the channel CODEC processor 104 is configured to receive coded data from and provide coded data to configurable modem processors 102a-102b. Details of the modem processors 102a-102b can be found in the above-referenced co-pending United States patent application.

Channel Codec Processor

Figure 2:
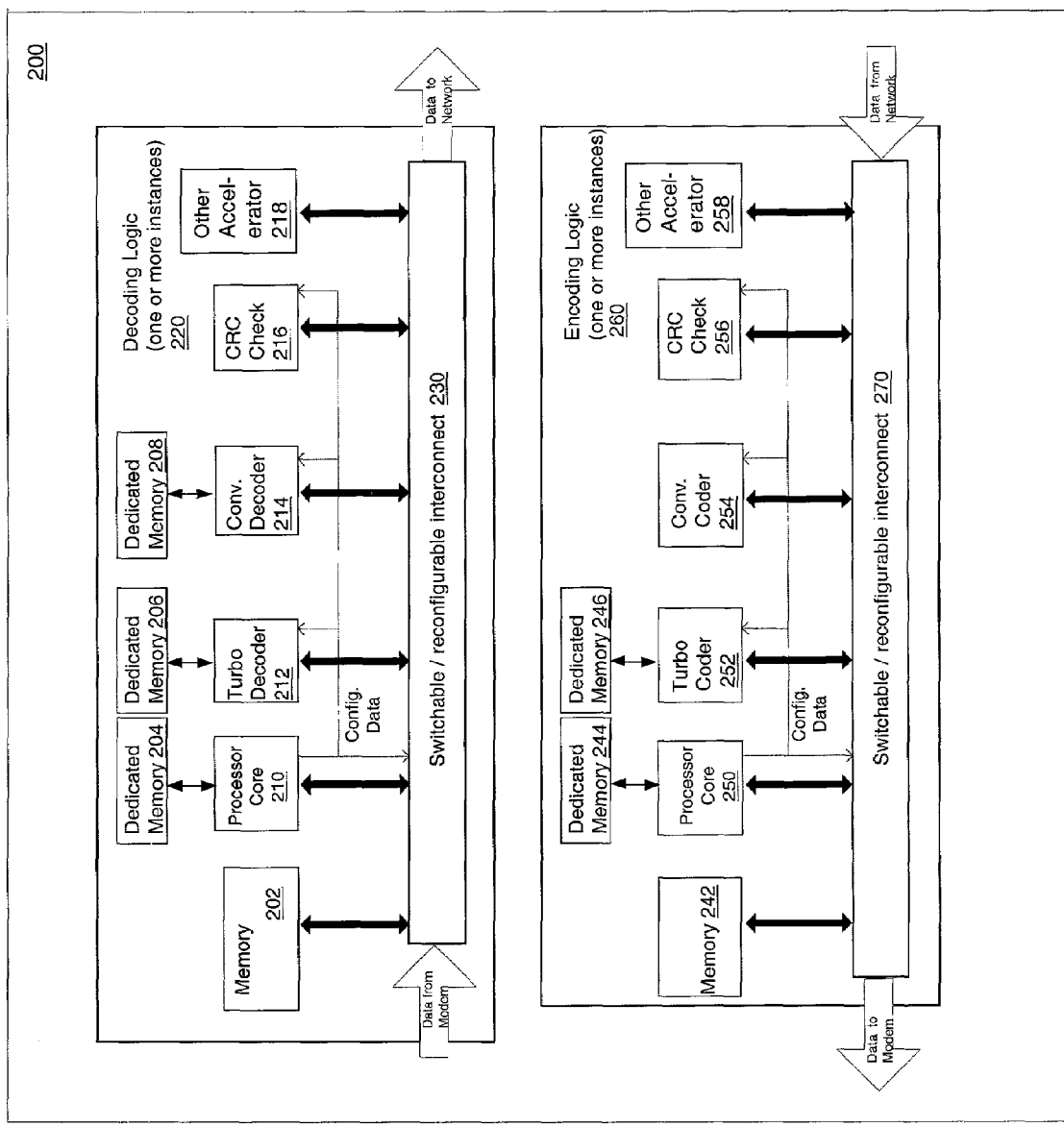
FIG. 2 is a block diagram of a channel CODEC processor in accordance with one embodiment of the present invention.

FIG. 2 is a block diagram of a channel CODEC processor 200 in accordance with one embodiment of the present invention. The channel CODEC processor 200 can be user-configured to perform CODEC operations for one or a number of communication standards by downloading different microprograms and hardware configurations. As shown, decoding logic 220 includes memories 202-208, a processor core 210, algorithm-specific kernel blocks 212-218 that function as decoding "accelerators," and a switchable/reconfigurable interconnect 230 that is coupled to the memory 202, the processor 210 and the algorithm-specific kernel blocks 212-218. The decoding logic 220 receives streams of demodulated data from a modem processor via the switchable/reconfigurable interconnect 230, performs various decoding operations on the data streams, and outputs the decoded data. In the present embodiment, the various algorithm-specific coding and decoding operations performed by the decoding logic 220 may include Turbo decoding, Viterbi decoding, convolutional decoding, CRC generation and check, Rate Matching, Bit group extraction, etc.

Also shown in FIG. 2 is encoding logic 260, which includes a switchable/reconfigurable interconnect 270, memories 242-248, a processor core 250 and algorithm-specific kernel blocks 252-258 that function as encoding "accelerators." In other embodiments, encoding logic 260 includes different numbers of memories, algorithm-specific kernels, processor cores and interconnects. The encoding logic 260 receives data streams from an external source (e.g., a network), performs various encoding operations on the data, and provides streams of encoded data to a modem processor via the switchable/reconfigurable interconnect 270. The various algorithm-specific encoding operations performed by the encoding logic 260 may include Turbo encoding, convolutional encoding, CRC generation and check, Rate matching, Bit group insertion, etc. In one embodiment, processor cores 210 and 250 are instruction-set processors capable of multi-threaded operations. Advantageously, multi-threading allows the resources of the channel CODEC processor 200 to be flexibly applied to accommodate a varying number and type of data streams of a wide range of different wireless communication standards. For example, separate threads may be associated with the input and output transfers of the data-stream processor(s) to and from kernels or memory. Software FIFOs can be implemented in microcode running on the data stream processor cores to further de-couple the production of data items in the processor cores from the consumption of data items in the kernels, and vice-versa.

The algorithm-specific kernel blocks 212-218 and 252-258, in one embodiment, are user-configurable. That is, operation parameters of algorithm-specific kernel blocks 212-218 can be modified by the user to accommodate variations dictated by various wireless communication standards. Furthermore, switchable/reconfigurable interconnects 230 and 270 functionally implement bussing and switching, and can be reconfigured as appropriate to allow processing of data streams that require different encoding/decoding sequences. In the present embodiment, the interconnects 230 and 270 are similar to programmable interconnects commonly found in many Field Programmable Gate Arrays.

According to the present embodiment, less computationally intensive encoding and decoding operations (CODEC operations) are performed entirely by the processor cores 210 and 250, while more computationally intensive CODEC operations are performed partially or entirely by the algorithm-specific kernel blocks 212-218 and 252-258. While nothing prevents the execution of computationally expensive algorithms in the data stream processor cores, it is typically much more efficient to execute computationally expensive tasks using the associated kernels. For example, concatenation is performed entirely by the processor cores 210 and 250, while Turbo decoding is performed entirely by the algorithm-specific kernel block 212. Some processes, such as bit separation and rate matching, are partially performed by the processor core 210 and 250 and by the algorithm-specific kernel blocks 218 and 258. The channel CODEC processor 200 also has the flexibility to apply more computational effort (e.g., more processing cycles) to data streams that require more complex processing.

The operations and configuration of the channel CODEC processor 200 are controlled by user-defined programs. In other words, whether a particular CODEC operation is performed by the processor core or by the algorithms-specific kernel blocks or by both the processor core and the kernels is user-programmable. The number of processing cycles applied to each data stream is also user-programmable. These user-defined programs, which are stored as microcodes or microinstructions in the instruction memories of the processor cores, dictate where and how the encoding and decoding processes are executed and how much computational effort is applied to each data stream. In particular, the microcodes, when executed by the processor cores 210 and 250, cause the processor cores 210 and 250 to generate appropriate control signals and configuration data for configuring the algorithm-specific kernel blocks 212-218, 252-258 and the interconnects 230 and 270 for specific wireless communication standards. In a typical implementation, the following steps are performed:

Read out configuration data from RAM;
Configure a kernel or a set of kernels according to the configuration data;
Process data using the configured kernel or set of kernels; and
Repeat the steps above if the configuration data changes.

In one embodiment, user-programs for the processor cores 210 and 250 can be modified at start-up (e.g., during system initialization) by scanning new instructions into their instruction memories via a scan-chain (not shown) or via a micro-processor programming interface. In one embodiment, the processor cores 210 and 250 can be programmed by the user using the Morphics Virtual Machine Interface, which is the subject of commonly assigned co-pending U.S. patent application Ser. No. 09/828,381 and, which is hereby incorporated by reference.

The configuration data and the related control signals for the algorithm-specific kernel blocks 212-218, 252-258 and the interconnects 230, 270, in one embodiment, are generated by the processor cores 210 and 250 at system start-up. In addition, the control signals and configuration data can be generated "on-the-fly." That is, the processor cores 210 and 250 can be programmed such that, upon detecting a data stream that requires a certain encoding/decoding operation, configures the algorithms-specific kernel blocks and the interconnects 230, 270 to perform the requisite operation(s). This is a preferred mode of operation in a base station since typically a number of possibly differently parameterized connections (e.g., different data rates, coding, etc.) need to be operated upon during each processing interval. A typical processing interval for 3GPP is 10 ms. Other processing intervals are possible and supported by the disclosed structures.

Note that memories 204-208 and 244-246 are coupled to processor cores 210, 250 and algorithm-specific kernel blocks 212-214 and 252. These memories serve as "local" memories for the processor cores and the kernel blocks. The use of these local memories ensures that the associated processors and kernel blocks can process data at maximum speed. Memories 202 and 242, which are shared by the processor cores and the algorithm-specific kernel blocks, ensure that relatively slower external memory accesses are kept to a minimum.

The memories 202 and 242 can be used to communicate data between processor cores and also serve as a central CODEC "bulk storage." A typical application within the field of communication devices in general and for the channel CODEC in particular is the use of these central memories for implementation of large input/output FIFO buffers, double/triple or general rotating buffering schemes and for the relatively large interleaving/de-interleaving buffers.

The channel CODEC processor 200, in one embodiment, can be programmed to provide the following functionality and features:
  reconfigurable Viterbi Decoders.
    user programmable code rate.
    user programmable constraint length.
    user programmable code.
  reconfigurable convolutional encoders.
    user programmable code rate.
    user programmable constraint length.
    user programmable code.
  reconfigurable Turbo Decoders (based on log-MAP [Maximum-A-Posteriori])
    user programmable maximum number of iterations.
    user programmable energy pre-scaling.
    user programmable iteration termination condition(s).
  reconfigurable Turbo Encoders.
  reconfigurable CRC Generators/Checkers,
    user programmable generator polynomials.
  Rate-matching index generators,
    user programmable index update parameters.
  Puncturing/depuncturing support.
  Interleaver and deinterleaver address generators
    table-based,
      user programmable algorithm selection: Max-Log-MAP or Log-MAP algorithm,
      or algorithm based (the algorithms used in the 3rd generation wireless standards are supported in hardware to minimize power consumption and table size).
  Block segmentation/concatenation HW support
    User programmable index update parameters.
    User programmable length parameters with associated selectable micro-interrupt capabilities.
    User programmable simultaneous Bit-Segmentation/Bit-concatenation support.
  Reed-Muller Coder for TFCI generation.
  Reconfigurable controller and arbiter for external SRAM access.

Figure 3:
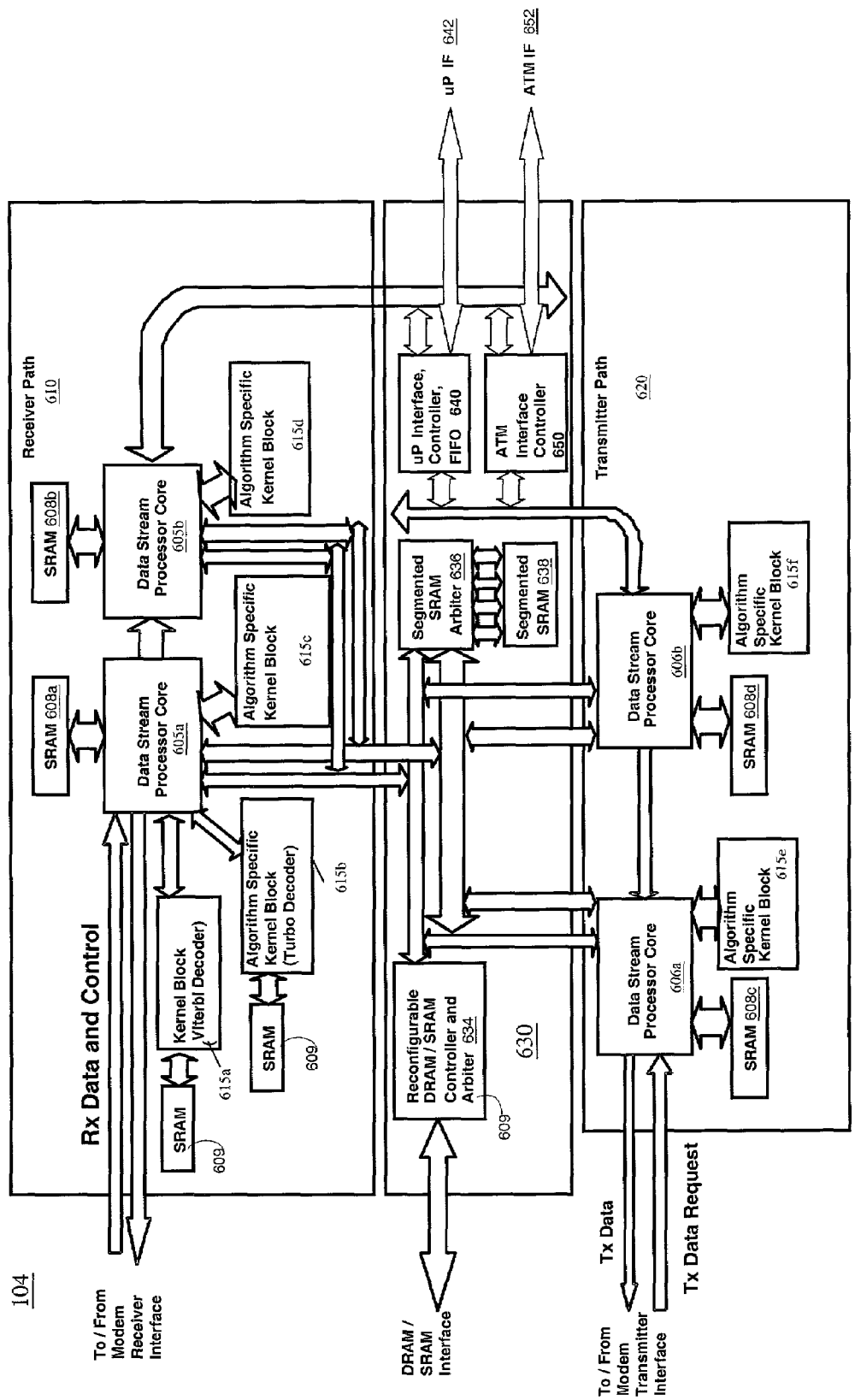
FIG. 3 is a block diagram of a channel CODEC processor in accordance with a preferred embodiment of the present invention.

FIG. 3 is a block diagram of a channel CODEC processor 104 in accordance with a preferred embodiment of the present invention. As illustrated, channel CODEC processor 104 includes a receiver path 610, a transmitter path 620 and an interface unit 630. The transmitter path 620 of channel CODEC processor 104 receives data from a network (via Asynchronous Transfer Mode (ATM) interface 650), encodes the data, and provides the encoded data to a modem processor (e.g., modem processor 102). Logic of the transmitter path 620 may add redundancy to the data. In one embodiment, the logic of the transmitter path 620 can be programmed to support the encoding functions required by the 3GPP-FDD standard. Particularly, in this embodiment, the encoding functions of this embodiment include the following steps:

CRC attachment: Error detection is provided on transport blocks through a Cyclic Redundancy Check. The CRC polynominal length in a preferred embodiment can vary between 0 to 31 bits. For example, for 3GPP, the CRC is 24, 16, 12, 8 or 0 bits. The length of the CRC that should be used for each TRCH can be determined at a higher layer.

Transport Block Concatenation: If there are multiple Transport Blocks in a block set/transport channel, they are concatenated into a single block.

Transport Block Segmentation: The concatenated blocks of data are segmented into blocks of appropriate size needed for encoding. The segmented blocks size depends on whether the transport block fits the available code block size as defined in the channel coding method.

Channel Coding: Code blocks are delivered to the channel coding block. The following channel coding schemes can be applied to the TrCHs:

Convolutional Coding, ½. The programmable code rate is set to ½ and the coefficients of the two associated programmable code polynomicals are set to the corresponding coefficients as defined by the 3GPP standard-561 octal and 763 octal. The length of the polynomicals is set to 9, as implied by the "zeros" for higher order coefficients.

Convolutional Coding, ⅓. The programmable code rate is set to ⅓ and the coefficients of the three associated programmable code polynomicals are set to the corresponding coefficients as defined by the 3GPP standard-557 octal, 663 octal, and 711 octal. The length of the polynomicals is set to 9.

Turbo Coding, ⅓. The programmable code rate is set to ⅓ and the coefficient of the three associated polynomicals are set to the corresponding coefficients is defined for turbo coding defined by 3GPP standard.

No Coding.

Concatenation of Encoded Blocks: After the channel coding for each code block, the encoded blocks are serially concatenated.

Radio Frame Size Equalization: Radio frame size equalization is padding the input bit sequence in order to ensure that the output can be segmented into an integer number of radio frame data segments of same size.

1st Interleaving: The 1st interleaving of inter-frame interleaving us used when the delay budget allows more than 10 ms of interleaving. The interlayer length of the first interleaving has been defined to be 20, 40 and 80 ms.

Radio Frame Segmentation: When the transmission time interval is longer than 10 ms, the input bit sequence is segmented and mapped onto consecutive number of radio frames.

Rate Matching: Rate matching means that bits on a transport channel are repeated or punctured. Higher layers assign a rate-matching attribute for each transport channel. This attribute is semi-static and can only be changed through higher layer signaling. The rate-matching attribute is used when the number of bits to be repeated or punctured is calculated.

Transport Channel Muxing: Every 10 ms, one radio frame from each TRCH is delivered to the TRCH multiplexing. These radio frames are serially multiplexed into a coded composite transport channel (CCTrCH).

Physical Channel Segmentation: If more than one Physical Channel (PhCH) is used, physical channel segmentation divides the bits among the different PhCHs.

2nd Interleaving: The 2nd interleaving is a block interleaver with inter-column permutations. Unlike the 1st interleaving process, the 2nd interleaver has fixed number of columns in the matrix –30 columns are used. Each physical channel produced by the physical channel segmentation process will be 2nd interleaved autonomously.

Physical Channel Mapping: The dedicated channels are coded and multiplexed and the resulting data stream is mapped sequentially (first-in-first-mapped) directly to the physical channel(s).

Coding of Transport-Format-Combination Indicator (TFCI): The TFCI is encoded using a (32, 10) sub-code of the second order Reed-Muller code.

Mapping of TFCI words:
  Normal Mode: The bits of the code word are directly mapped to the slots of the radio frame.
  Compressed Mode: The slot format is changed so that no TFCI coded bits are lost. The different slot formats in compressed mode do not match the exact number of TFCI coded bits for all possible TGLs. Repetition of the TFCI bits is therefore used.

In the above description, terminology of 3GPP is used to describe the functions of the reconfigurable/reprogrammable structures of the channel CODEC processor to implement the CODEC functionality of a specific communication standard. However, it should be noted that the described structures are not limited to 3GPP applications. Other coding and decoding algorithms, some of which are disclosed in illustrative United States patents listed below in Table 1 and incorporated herein by reference, can be carried out by the channel CODEC processor when it is appropriately programmed. Some other encoding/decoding algorithms are described in the following references:

A. Viterbi, "Error bounds for convolutional coding and an asymptotically optimal decoding algorithm", IEEE Trans. Information Theory, Vol IT-13, pp-.260-269, Apr. 1967;

G. Forney, "The Viterbi algorithm", Proc. of the EEE, Vol. 61, pp. 268-278, Mar. 1973; S. Bitterlich, H. Dawid and H. Meyr, Boosting the implementation efficiency of Viterbi Decoders by novel scheduling schemes, Proceedings IEEE Global Communications Conference GLOBECOM 1992, Orlando, Fla., pg. 1260-65;

S. Bitterlich, B. Pape and H. Meyr, "Area Efficient Viterbi-Decoder Macros",Proceedings of the European Solid-State Circuits Conference (ESSCIRC)94, Ulm/ Donau, Germany; and M. Vaupel, U. Lambrette, H. Dawid, O. Joeressen, S. Bitterlich, H. Meyr, F. Frieling, K. Mueller, "An all Digital Single-Chip Symbol Synchronizer and Channel Decoder for DVB" in Reis, Claesen, editors, VLSI: Integrated Systems on Silicon, pg 79-90, Chapman Hall, 1997.

Furthermore, although the components, units and logic blocks of the channel CODEC processor have been characterized as reconfigurable and/or reprogrammable, it should be appreciated that some of them do not need to be reconfigurable and/or reprogrammable. In an embodiment that is optimized for a subset of communication standards (e.g., 3GPP and cdma2000), some or all of those components, units and logic blocks can be hardwired to decrease the die area, removing unnecessary flexibility.

TABLE 1

| U.S. Pat. No. | Title |
|---|---|
| 5181209 | Method for generalizing the Viterbi algorithm and devices for executing the method |
| 5406570 | Method for a maximum likelihood decoding of a convolutional code with decision weighting, and corresponding decoder |
| 5446747 | Error-correction coding method with at least two systematic convolutional codings in parallel, corresponding iterative decoding method, decoding module and decoder |
| 5537444 | Extended list output and soft symbol output viterbi algorithms |
| 5563897 | Method for detecting information bits processed by concatenated block codes |
| 5721745 | Parallel concatenated tail-biting convolutional code and decoder thereof |
| 5721746 | Optimal soft-output decoder for tail-biting trellis codes |
| 5729560 | Method and coding means for protecting transmission of data on the basis of multi-component coding |
| 5734962 | Satellite communications systems utilizing parallel concatenated coding |
| 5761248 | Method and arrangement for determining an adaptive abort criterion initerative decoding of multi-dimensionlly coded information |

With reference still to FIG. 3, receiver path 610 is configured to receive data from a modem processor (e.g., modem processor 102). Control signals (e.g., hand-shakes) are sent from the CODEC processor 104 to the modem processor. Logic of the receiver path 610 performs a variety of decoding and error-correction operations on the received data. In one embodiment, the logic of the receive path 610 can be programmed to support the decoding functions required by the 3GPP-FDD standard. Particularly, the decoding functions of this embodiment include the following steps:

2nd De-interleaving.
  Physical Channel De-segmentation.
  Removal of the DTX bits. In the downlink, DTX is used to fill up the radio frame with bits. This step removes the DTX bits.
  Transport Channel De-muxing.
  Radio Frame De-segmentation.
  1st De-interleaving.
  Rate De-matching.
  Channel De-coding.
    No Decoding.
    Viterbi Decoding.
    Turbo Decoding.
  Transport Block De-segmentation.
  Transport Block De-concatenation.
  CRC Extraction and Verification.

With reference still to FIG. 3, channel CODEC processor 104 includes multiple programmable data stream processor cores 605a-605b and 606a-606b, which are augmented with algorithm-specific kernel blocks 615a-615f for supporting the implementation of the functions listed above. Some of the functions can be performed without additional hardware kernels by using the native instruction set of the data stream processor cores. For example, all of the block concatenation and block segmentation steps can be carried out by the processor cores without hardware kernel support. In the present embodiment, each of the data stream processor cores 605a-605b, 606a-606b is an instruction-set processor that is highly optimized for channel encoding and decoding operations. Specific optimizations include constrained instruction sets, rapid interrupt handling, rapid process switching, and high-speed access of local memory. Each of the data stream processor cores 605a-605b, 606a-606b is capable of multi-threading of multiple processes, that is, semi-simultaneous execution of multiple processes with independent threads-of-control. The corresponding program counters for each independent control thread are maintained in hardware in a preferred embodiment. In other words, the hardware can support low-overhead multithreading. Using the algorithm-specific kernel blocks 615a-615f, processor cores 605a-605b can be programmed to perform CODEC operations using fewer instructions. A lower processor clock rate is therefore possible. Thus, power consumption of the channel CODEC processor 104 can be reduced without compromising performance.

In the illustrated embodiment, each of the data stream processor cores 605a-605b, 606a-606b is programmable for carrying out one or more stages of the coding/decoding pipeline. The particular stages of the coding/decoding pipeline for which each data stream processor core is responsible is determined by a user (e.g., a system designer) according to the requirements of the target communication standard. For example, if the channel CODEC processor 104 is configured for the 3GPP communication standard, the data stream processor core 605a is programmed to handle Viterbi decoding and Turbo decoding, and the data stream processor core 605b is programmed to handle CRC calculation and verification, segmentation, deinterleaving, depuncturing, etc. Although the illustrated embodiment includes four data stream processor cores in the receiver path 620 and the transmitter path 610, any number of data stream processor cores can be used. Even a single data stream processor core can be used if the throughput requirements of the application are low enough. The number of processor cores used depends on the specific requirements of the communication standard and the number of users the host communication device is designed to support. Coding and decoding operations can also be performed by the processor cores 605a-605b, 606a-606b without using the algorithm-specific kernel blocks. In those instances, the coding and decoding operations are done entirely within the registers, ALUs, etc., of the processor cores. Some operations are performed partially by the processor cores 605a-605b, 606a-606b and partially by the algorithm-specific kernel blocks.

In one embodiment, the data stream processor cores 605a-605b, 606a-606b can operate in a dynamically "time-sliced" mode, (e.g., time-multiplexed mode), based on the relationship between the computational requirements of the encoding or decoding algorithms, the computational capabilities of the data stream processors, and the processing requirements of the communication protocol. In a time-sliced mode, the data stream processor cores 605a-605b, 606a-606b are programmed to devote more processing cycles to data streams that require more computations and fewer processing cycles to data streams that do not require as many computations. For example, a 12.2 kbps voice channel requires significantly fewer clock cycles than is required by a 384 kbps data channel. Thus, the corresponding time slice for the voice channel would be much shorter. An advantage of this aspect of the invention is that the channel CODEC processor 104 can be dynamically configured to handle a large number of low rate channels, a small number of high rate channels, or any combination of high rate, medium rate and/or low-rate channels depending on the requirements of the target communication device in which the CODEC processor 104 is used.

With reference still to FIG. 3, the data stream processor cores 605a-605b, 606a-606b are capable of intercommunicating data and control information (e.g., prioritized process switches/interrupts). This intercommunication mechanism allows certain coding/decoding operations to be shared by multiple processor cores and enables a "stream-driven" orchestration of overall encoding/decoding processing requirements. This "distributed" architecture enhances performance of the processor 104 and lessens the need for centralized control. To increase performance further, the data stream processor cores 605a-605b, 606a-606b and the algorithm-specific kernel blocks use local memory for processing data. For example, as shown in FIG. 3, data stream processor cores 605a-605b, 606a-606b are coupled to Static Random Access Memories (SRAMs) 608a-608b and algorithm-specific kernel blocks 615a and 615b are coupled to SRAMS 609. This is advantageous over reliance upon central memory in terms of operating speed and power efficiency. It should be noted, however, that local memory is optional for each data stream processor. It should also be noted that the present invention does not have to include local memories or SRAMs.

Some of the algorithm-specific kernel blocks 615a-615f can be reconfigurable and some of them can be non-reconfigurable. For reconfigurable kernel blocks, operation parameters can be modified to accommodate specific requirements of a particular standard or application of interest. As an example, in the embodiment as illustrated in FIG. 3, kernel block 615a contains an algorithm-specific kernel that is tailored to perform Viterbi decoding. The kernel block 615a, however, also contains logic that allows the user to modify the operational parameters (e.g., code polynomial, depuncturing pattern, traceback method, etc.) of the kernel. In one embodiment, reconfigurable kernel blocks are configured at start-up (e.g., during system initialization) when appropriate control signals and configuration data are generated by the processor cores or other logic of the channel CODEC processor. The control signals and configuration data can also be generated "on-the-fly." That is, the processor cores 605a-605b, 606a-606b can be programmed such that, upon detecting a data stream that requires a certain CODEC operation, they configure the algorithm-specific kernel blocks and the interconnects 230, 270 such that they become suitable to perform the requisite operation(s).

The interconnection between the data stream processors 605a-605b, 606a-606b and the hardware kernel blocks 615a-615f can be modified for accommodating the specific needs of different communication standards. In one embodiment, the interconnections are reconfigurable by the data stream processor cores 605, or via the μP interface controller 640. Further, the interconnections are similar to programmable interconnects commonly found in Field Programmable Gate Arrays (FPGAs). This reconfigurability allows the data flow of the channel CODEC processor 104 to be adapted easily to different wireless communication standards that have different sequences in encoding/decoding data.

Also illustrated in FIG. 3 are reconfigurable DRAM/SRAM controller 634, Segmented SRAM Arbiter 636, Segmented SRAM 638, μP interface controller 640 for providing an interface to an external microprocessor (e.g., within controller 110), and a network interface controller 650 for providing an interface to a networking device (e.g., ATM Utopia/HDLC 108). The reconfigurable DRAM/SRAM controller 634 controls access to and allocation of external SRAM/DRAM. Thus, a hierarchical approach to memory utilization is established: the SRAM dedicated to each data stream processor core is the fastest, consumes the least power per accessed bit, but is least shared; the shared internal SRAM is larger but slower, and the external DRAM/SRAM is the largest, consumes the most amount of power per bit accessed, and is typically used for block data access, e.g., 512 or more bits at a time (single-word random access of DRAM is not preferred, as it typically require multiple clock cycles and is therefore relatively inefficient). Additionally, some kernel blocks (e.g., blocks 615a-615b) may have their own dedicated local memory. This is advantageous for kernels that autonomously perform computationally intensive and memory intensive operations on entire data blocks. Typical examples are Viterbi decoders and Turbo decoders.

In the present embodiment, a segmented SRAM 608 is shared by the processor cores 605a-605b, 606a-606b. It should be noted that non-segmented SRAM may also be shared by the processor cores 605a-605b, 606a-606b. The segmented SRAM 608 enables multiple data stream processor cores to access the shared memory during the same clock cycle.

With reference still to FIG. 3, the microprocessor interface (μP IF) 642 is provided to receive control data, as well as reconfiguration data and/or instructions and/or data for the data stream processor cores 605a-605b, 606a-606b, from the host communication device. The network interface (ATM IF) 652 is provided for communicating with the host communication device and/or any external devices. In one embodiment, this network interface functions according to the asynchronous transfer mode (ATM) standard.

Data Stream Processor Cores

According to a preferred embodiment of the present invention, data stream processor cores are used for controlling the channel CODEC processor 104. The data stream processor cores utilize an instruction set that is optimized for CODEC applications and is capable of executing and managing the execution of multiple concurrent processes. In particular, the data stream processor preferably is capable of hardware task-switching and is capable of completing task-switching in a single clock cycle. Preferably, the operations of the data stream processor cores are controlled by microcodes stored within its instruction memories.

Figure 4:
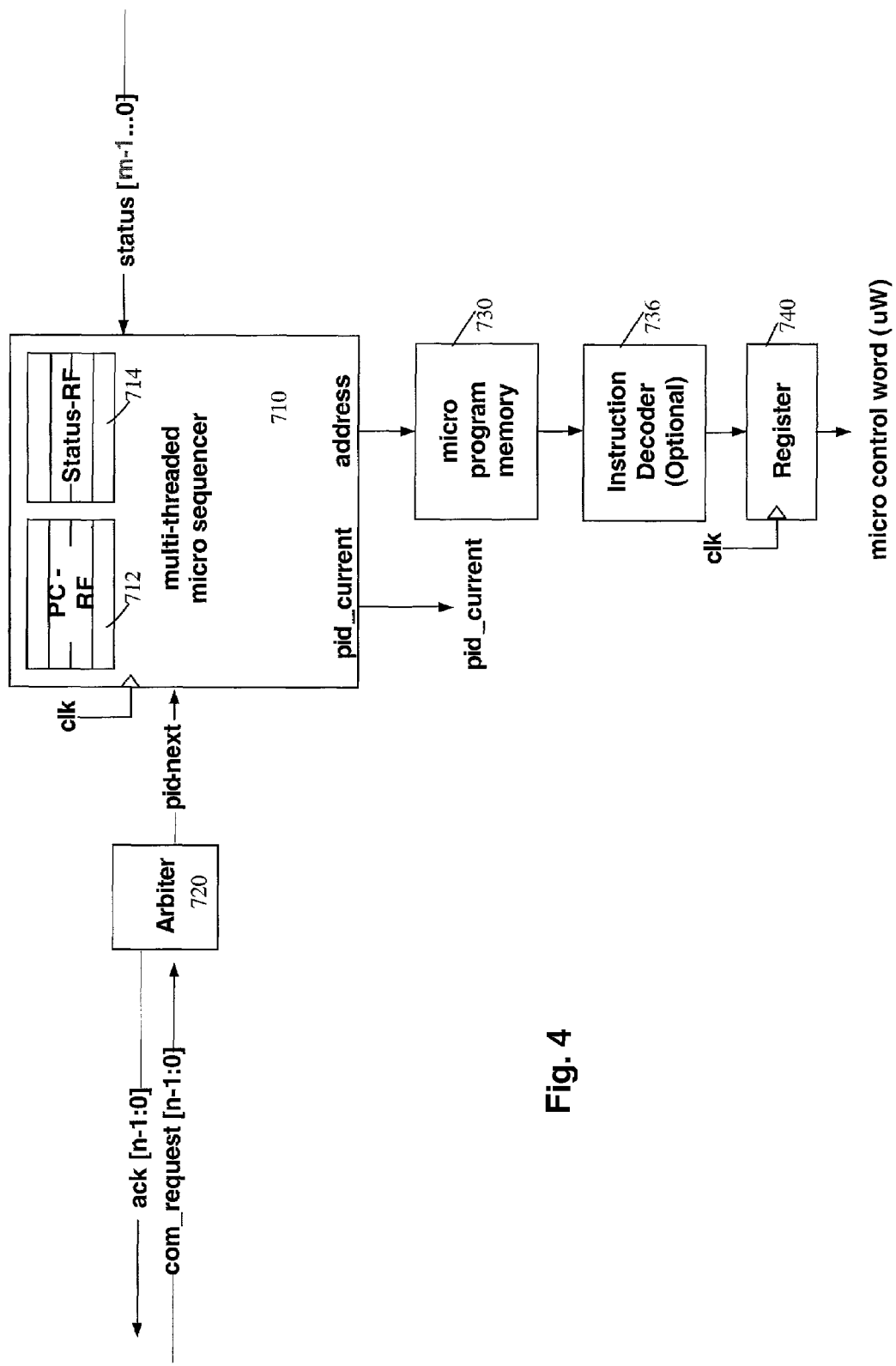
FIG. 4 illustrates a block diagram of a control portion of a data stream processor in accordance with an embodiment of the present invention.
Figure 5:
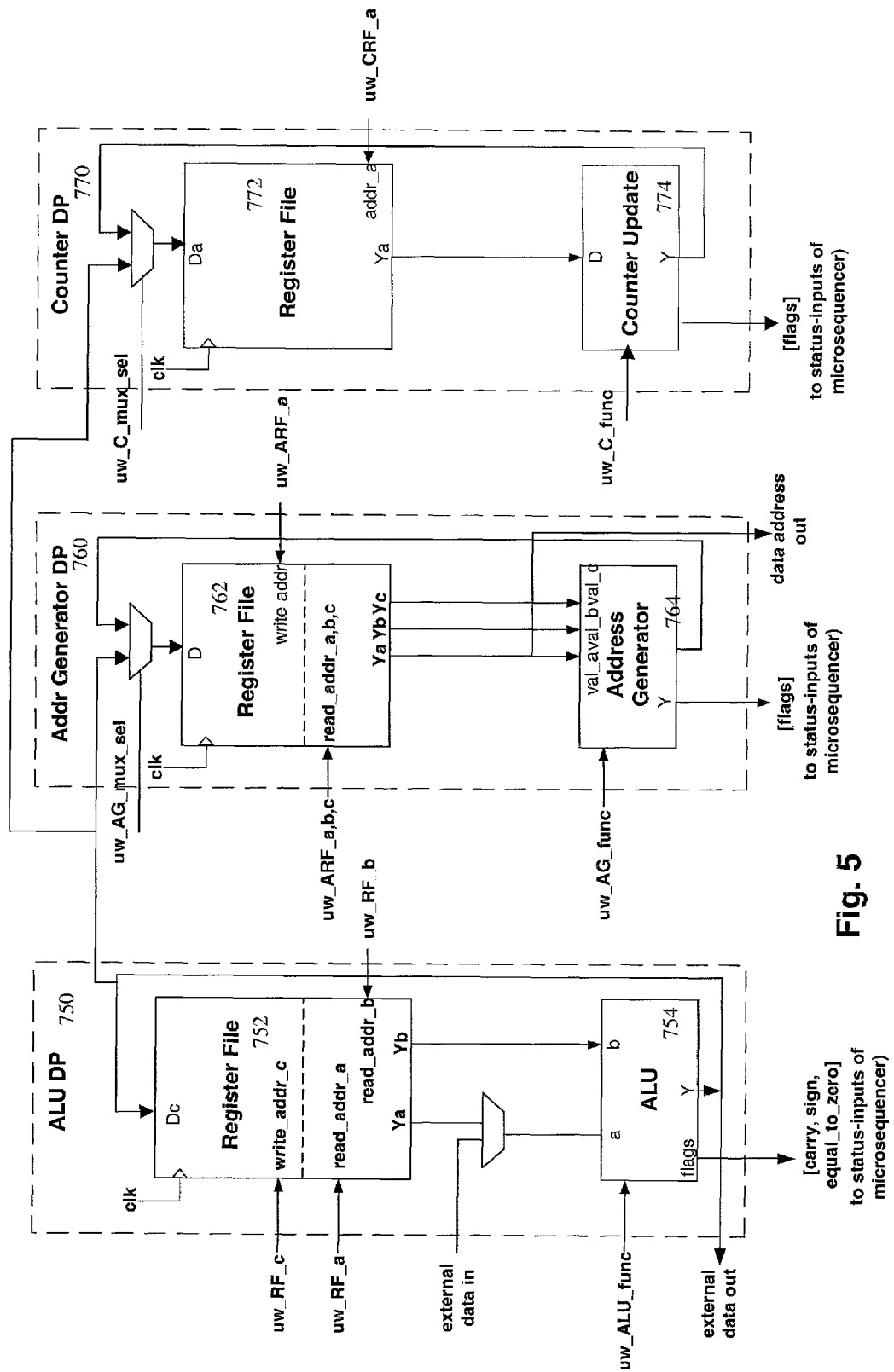
FIG. 5 illustrates a block diagram of a data path portion of a data stream processor in accordance with an embodiment of the present invention.

FIGS. 4-5 are block diagrams illustrating portions of a data stream processor core in accordance with an embodiment of the present invention. Specifically, FIG. 4 illustrates a control path portion of the data stream processor core, and FIG. 5 illustrates a data path portion of the data stream processor core. Other portions of the data stream processor cores not described herein are well known to those ordinarily skilled in the art.

In the present embodiment, the data stream processor core is capable of multi-threading. That is, the data stream processor core can perform multiple tasks in parallel. During multi-threading, it is important to keep the threads isolated such that the program counter and status register for one thread are not overwritten by data from another thread. To this end, the data stream processor core of the present invention provides a multi-threaded micro-sequencer circuit 710 including a Program Counter Register File (PC-RF) 712 and Status Register Files (Status-RF) 714 for storing the program counters and status flags of multiple threads that are being processed by the processor core. The processor core further includes an arbiter 720, a micro-program memory 730, an optional instruction decoder 736, and a register 740. The arbiter 720, which is typically implemented as a priority encoder, determines the thread to be run next by the processor core. Particularly, in the illustrated embodiment, the arbiter 720 receives an access request com_req [n−1:0], determines whether the access request has a higher priority than other requests that it might have received in previous cycles, and generates a signal pid_next for the multi-threaded micro-sequencer 710. The signal pid_next indicates the thread number (or process identification number) to be processed by the micro-sequencer 710 in the next cycle. The micro-sequencer 710, upon receiving the pid_next signal, looks up the program counter and status flags of the thread, and generates an address (e.g., the value of the program counter read from PC-RF) and a pid_current signal. The address is provided to the micro-program memory 730. The micro-control words (μW) corresponding to the address are provided to the register 740 to be outputted. Once the pid_next signal is generated by the arbiter, an acknowledge signal ack[n−1:0] is generated by the arbiter and provided to the device that initiated the corresponding highest-priority access request.

Advantageously, by providing an array of program counters and status registers, context information does not need to be saved explicitly by software. Instead, this can be done implicitly and automatically by hardware. Thus the data stream processor core is able to execute a task-switch in a single clock cycle. This enables very efficient mapping of the functionality of a given communications block diagram to available multiple processes, since process switches can occur without any time penalty for saving the context (e.g., as in prior art processors used for implementing channel CODECs, for writing the context to a stack, etc.).

The data stream processor core is specialized for handling data streams. Specifically, the data stream processor core includes internal accelerated data paths that support data stream handling. In one embodiment, the multiple data paths of the processor core operate concurrently with each other. This approach allows processing of multiple operations to be completed in one clock cycle, thereby promoting overall efficiency of the CODEC processor. FIG. 5 illustrates several data paths of the processor core. Specifically, an ALU data path (ALU DP) 750, an address generator DP 760, and a counter DP 770 are shown. The data paths 750, 760, 770 are controlled by micro-control words received from the control section. Note that many variations of the data path structures are possible.

As illustrated in FIG. 5, ALU DP 750 includes a multi-ported register file 752, a multiplexor for receiving an external data input, and an ALU 754. Address generator DP 760 includes register file 762 and address generator 764. Address generator 764 generates addresses for handling data streams, thus alleviating ALU 754 of the burden of address generation and increasing the performance of the processor. The counter DP 770 includes register file 772, and counter update unit 774. The counter DP 770 is used for counting a number of data to be processed. Note that the address generator DP 760 and counter DP 770 receive external data via the ALU DP 750. While similar datapaths are used in prior-art devices, (e.g., microprocessors and DSPs,), a novel aspect of the present invention is that it advantageously combines a parallel datapath with the multi-threaded control section for CODEC applications. Operations of the data paths 750, 760, and 770 are controlled by the micro-control words. The micro-control words are typical but not necessarily very long instruction words (VLIWs), and may be broken down to multiple sub-words. A number of these sub-words, e.g., uw_ALU_func, uw_RF_c, uw_AG_mux_sel, etc. are illustrated in FIG. 5.

It should be understood that the control paths and data paths of FIGS. 4 and 5 are for illustrating features of the data stream processor core that are relevant to the present invention. Other implementations of data stream processors with or without these features can be used. A detailed description of multithreading processors can be found, for example, in:

Kai Hwang, "Advanced computer architecture", McGRAW-Hill International, 1993, ISBN 0-07-113342-9;

H. Hirata et. al., "An elementary processor architecture with simultaneous instruction issuing from multiple threads", Proc. 19th annu. Int. Symp. Computer Arch., 1992.

Algorithm-Specific Kernel Blocks and Kernels

In accordance with the present invention, the algorithm-specific kernel blocks are highly user-customizable. In one embodiment, the configurations of the algorithm-specific kernel blocks are user-customizable by user-programs. The interaction between the algorithm-specific kernel blocks and other logic of the channel CODEC processor is also user-customizable by user-programs. This aspect of the invention allows the users to introduce their own custom designs in the channel CODEC processor, allowing the users to differentiate their products from others and allowing the CODEC processor to adapt easily to future wireless communication protocols.

Figure 6:
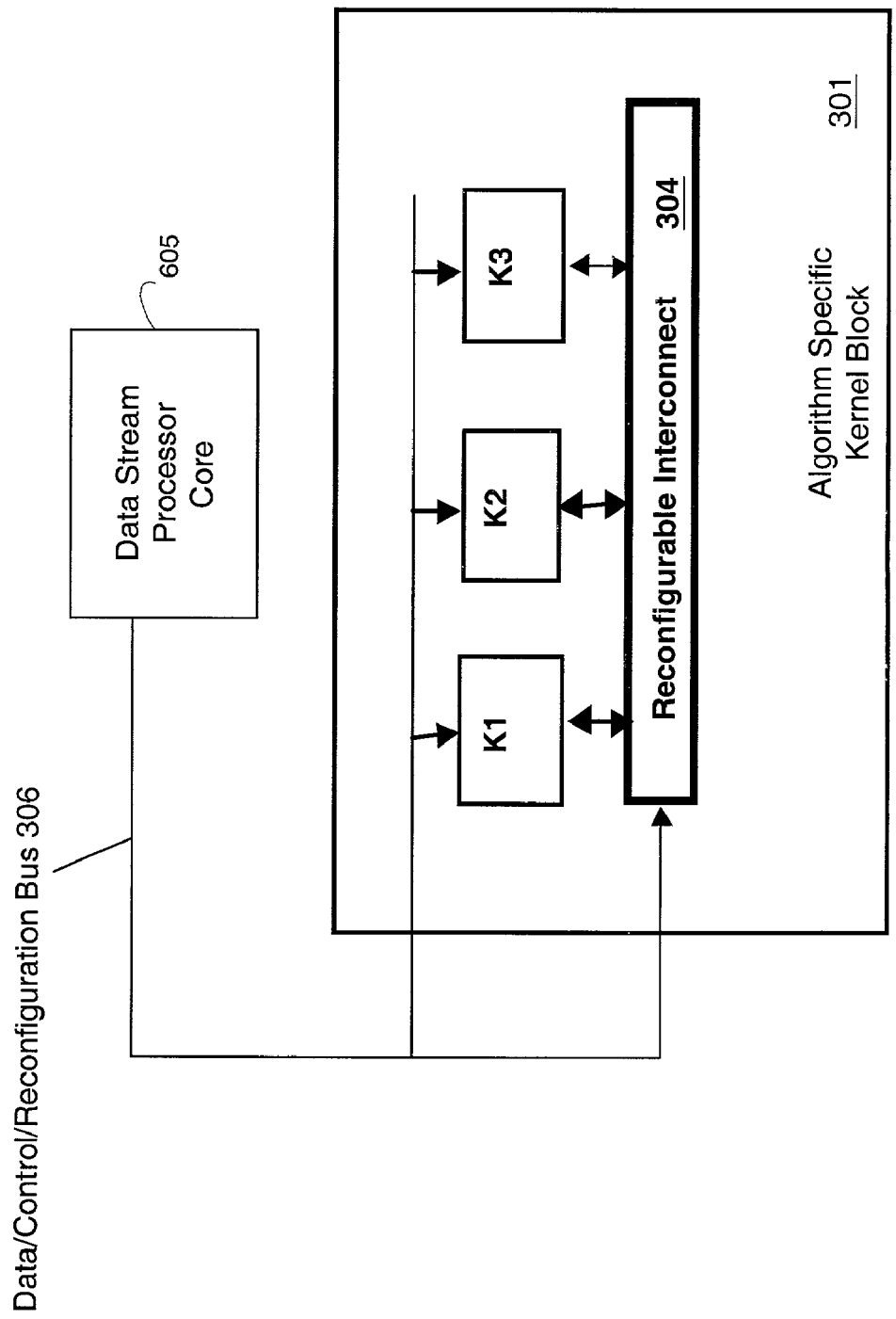
FIG. 6 is a block diagram of a hardware kernel block in accordance with one embodiment of the present invention.

FIG. 6 illustrates a kernel block 301 coupled to a data stream processor core (e.g., core 605*b*) in accordance with one embodiment of the present invention. Kernel block 301 includes algorithm-specific kernels that are reconfigurable for a range of protocols and/or signal processing algorithms within an application, or within a range of applications, with maximal efficiency. Additionally, kernel block 301 is modular, and thus can be configured to operate in groups. Furthermore, the functionality of kernel block 301 is scalable. That is, depending on the throughput requirements of the CODEC processor, multiple kernel blocks 301 can be instantiated to meet the throughput requirements.

As illustrated in FIG. 6, kernel block 301 includes algorithm-specific kernels K1 through K3 that are coupled to a reconfigurable interconnect 304 in one embodiment, or to a bus in another embodiment. Reconfigurable interconnect 304 includes buses and/or multiplexor-based reconfigurable interconnections and/or mesh-network type interconnects commonly found in Field Programmable Gate Arrays. Data passes among the kernels K1-K3, the host communication device, and/or the data stream processor core via an input/output line (not shown) coupled to reconfigurable interconnect 304. Data also passes among the data stream processor core, the kernels K1-K3 and the reconfigurable interconnect 304 via data/control/reconfiguration bus 306. Configuration data passes from the data stream processor core to the reconfigurable interconnect 304 and kernels K1 through K3 via the data/control/reconfiguration bus 306. In the present embodiment, the configuration data is generated by the data stream processor core according to the microcodes that it executes.

In one embodiment, algorithm-specific kernels K1 through K3 are logic circuits tailored to perform particular data processing functions found in wireless communication standards and protocols, such as 3GPP. For instance, algorithm-specific kernel K1 includes specialized logic circuits for calculating interleaving addresses; algorithm-specific kernel K2 includes specialized logic circuits for performing convolutional coding; and, algorithm-specific kernel K3 includes specialized logic circuit for performing CRC calculation and/or verification. Kernels K1 through K3 can be heterogeneous with respect to one or more of each other, in terms of programmability, algorithmic-capability, performance-level, and/or math-logic. Two or more kernels, however, can also be homogeneous. The specific composition and relationship among the kernels depend upon the specific application of the channel CODEC processor in which the kernel block is used. One or more of kernels K1 through K3 may also be autonomous, thus allowing parallel processing of data, on a kernel-by-kernel basis, or on a kernel-group by kernel-group basis. Because of this autonomy, the individual algorithm-specific kernels K1-K3 are data-rate scalable to a range of system clock rates.

Although the algorithm-specific kernels K1-K3 include circuitry tailored for performing specific types of data processing operations, the kernels K1-K3 are user-reconfigurable within a class of functions. For example, the application specific kernel K1 may contain logic circuits tailored for carrying out convolutional coding. Logic for performing convolutional coding is well known. A description of exemplary convolutional coders may be found in "Error-Correction Coding for Digital Communications," by George C. Clark, 1981. A reconfigurable convolutional coder may incorporate externally controllable logic (e.g., multiplexors, etc.) into the convolutional coder logic. Various techniques of implementing reconfigurability are described in detail in the U.S. patent application bearing Ser. No. 09/772,584.

Figure 7:
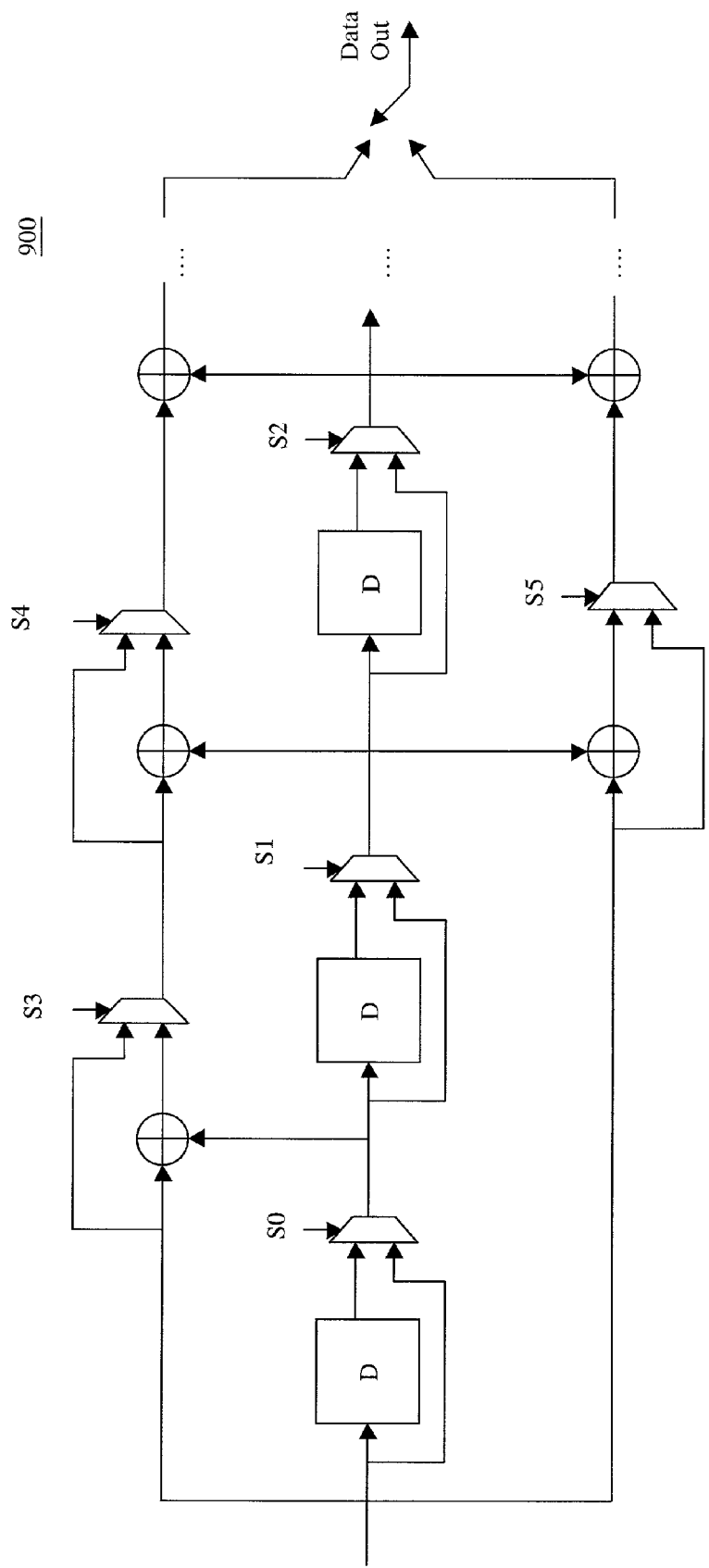
FIG. 7 is a block diagram of a reconfigurable convolutional encoder in accordance with an embodiment of the present invention.

An algorithm-specific kernel 900 utilized as a reconfigurable convolution encoder is illustrated in FIG. 7. Preferably, the reconfigurable kernel convolution encoder 900 can be configured for encoding data with a number of different code polynomials. By providing proper control signals S0-S5 to the multiplexors, the registers and modulo-2 adders of convolution circuit 900 can be selectively by-passed, thus varying the code polynomial of the encoder 900. The control signals S0-S5, in the present embodiment, are determined by the data stream processors (in response to user-defined instructions) when the algorithm-specific kernel 900 is initialized. In some embodiments, the code rate and the constraint length are reconfigurable also.

Figure 8:
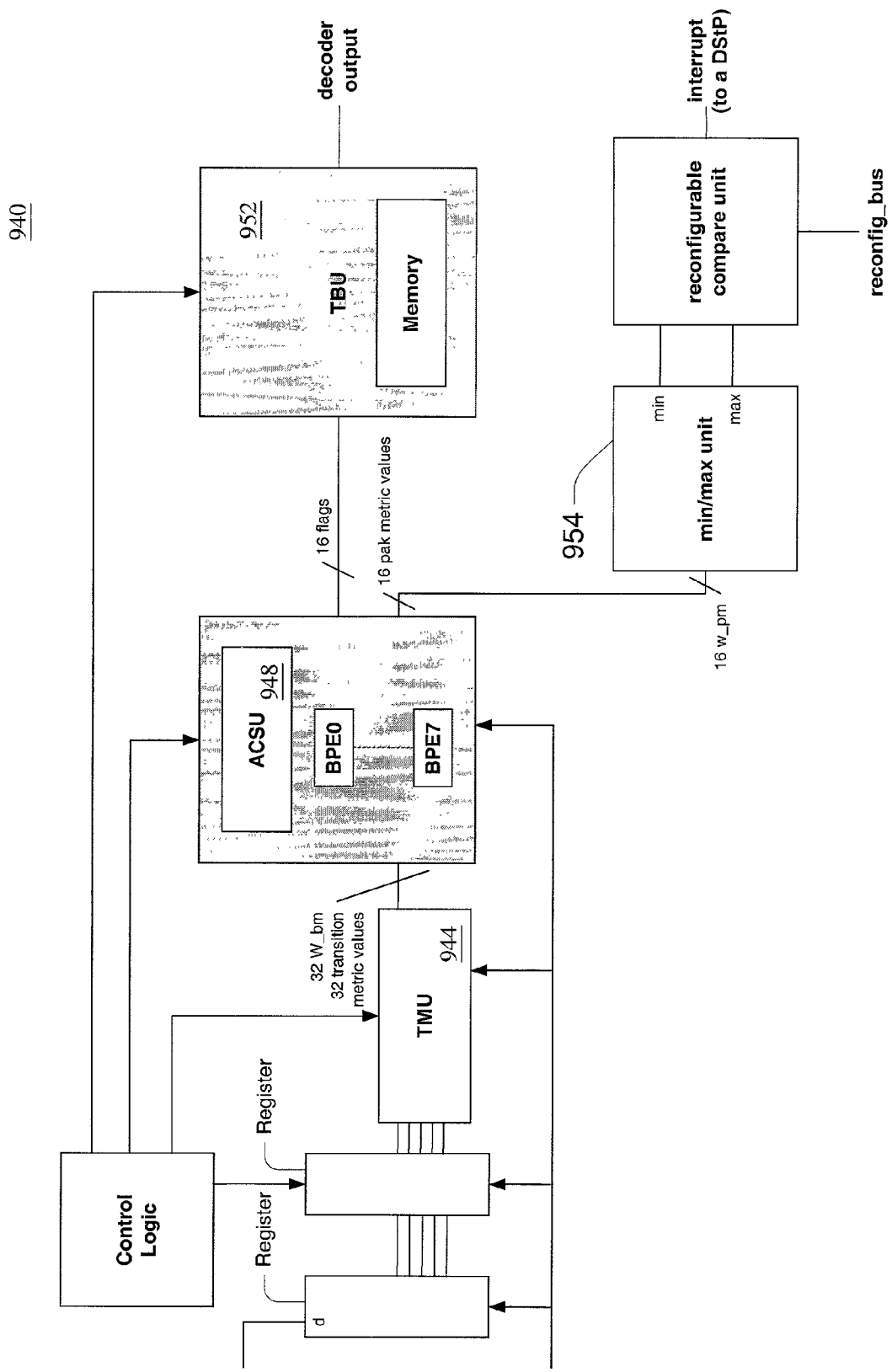
FIG. 8 is a block diagram of a Viterbi decoder in accordance with an embodiment of the invention.

Attention now turns to FIG. 8, which is a block diagram of an algorithm-specific kernel block 940 utilized as a reconfigurable Viterbi decoder. The kernel block 940 includes a reconfigurable transition metrics unit (TMU) 944, a reconfigurable Add-Compare-Select Unit (ACSU) 948 and an optional trace back unit (TBU) 952. In some embodiments, the trace back (TB) algorithm can be implemented in software.

The reconfigurable TMU 944 in accordance with the present invention includes user-programmable code polynomials of the underlying convolutional code. Thirty-two transition metric values are generated per clock cycle to "feed" the sixteen ACS processing elements used in the reconfigurable ACSU 948 in one embodiment.

The reconfigurable ACSU 948 of the present embodiment includes eight butterfly processing elements (BPE). By using these BPEs, the path metric and branch metric data can be shared, reducing the memory bandwidth for the path metric storage by a factor of two.

The reconfigurable ACSU 948 of the present embodiment may be augmented by a min/max path metric search unit 954 for blind transport format detection. This min/max unit 954 is able to find the maximum and minimum of the sixteen path metric values the ASCU 948 produces in one clock cycle. In one embodiment, the min/max unit 954 includes sixteen maximum selectors and sixteen minimum selectors, which are arranged in two binary trees (one tree for maximum selection and one tree for minimum selection). In one embodiment where pipeline registers are added, for example, after every second min/max stages of the tree to reduce the critical path, the latency is two clock cycles.

Figure 9:
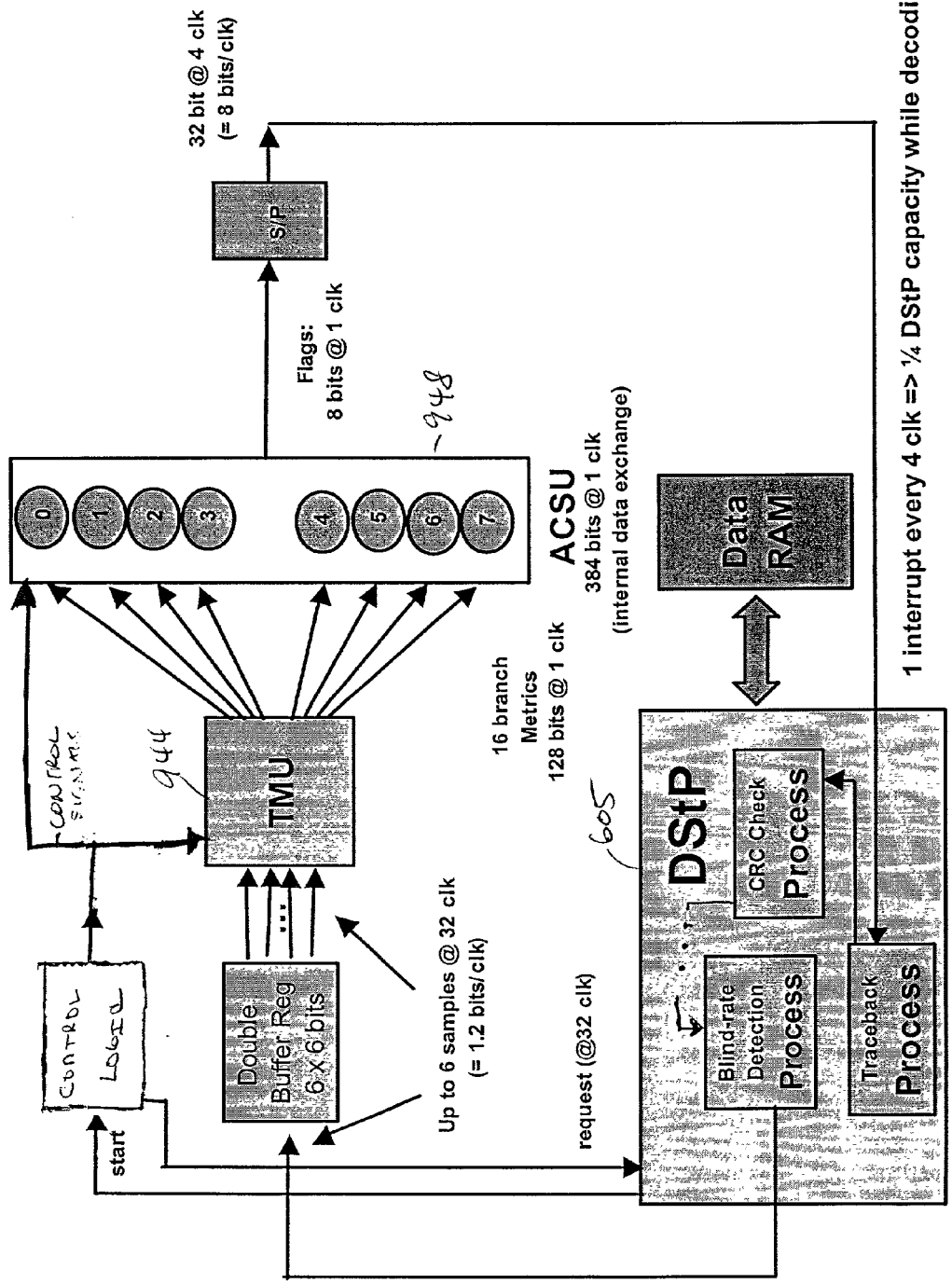
FIG. 9 is a block diagram of a Viterbi decoder that is implemented partially by an algorithm-specific kernel block and partially by the data stream processor cores where the trace back (TB) functionality of the Viterbi decoder is implemented as a process of a data stream processor core.

In another embodiment, some operations of the Viterbi decoding process can be carried out by the data stream processor core. This embodiment is illustrated in FIG. 9. As shown, the kernel block includes a reconfigurable transition metrics unit (TMU) 944, a reconfigurable Add-Compare-Select Unit (ACSU) 948, and control logic for controlling and configuring the TMU 844 and ACSU 948. The kernel block of FIG. 9, however, does not have specialized circuits for performing Traceback operation. In this embodiment, the Traceback operation, the CRC check operation, and the Blind-rate Detection operation of the Viterbi decoder are performed as tasks on a data stream processor core 605. In another embodiment, a special shift register with reconfigurable capabilities for bit-insertion can be used to accelerate the traceback functionality. In yet another embodiment, the Traceback function can be implemented fully in hardware. Implementing the entire Traceback function in hardware would lead to fewer interrupts or task switches for the data stream processor core. More die area would be required, however.

Figure 10:
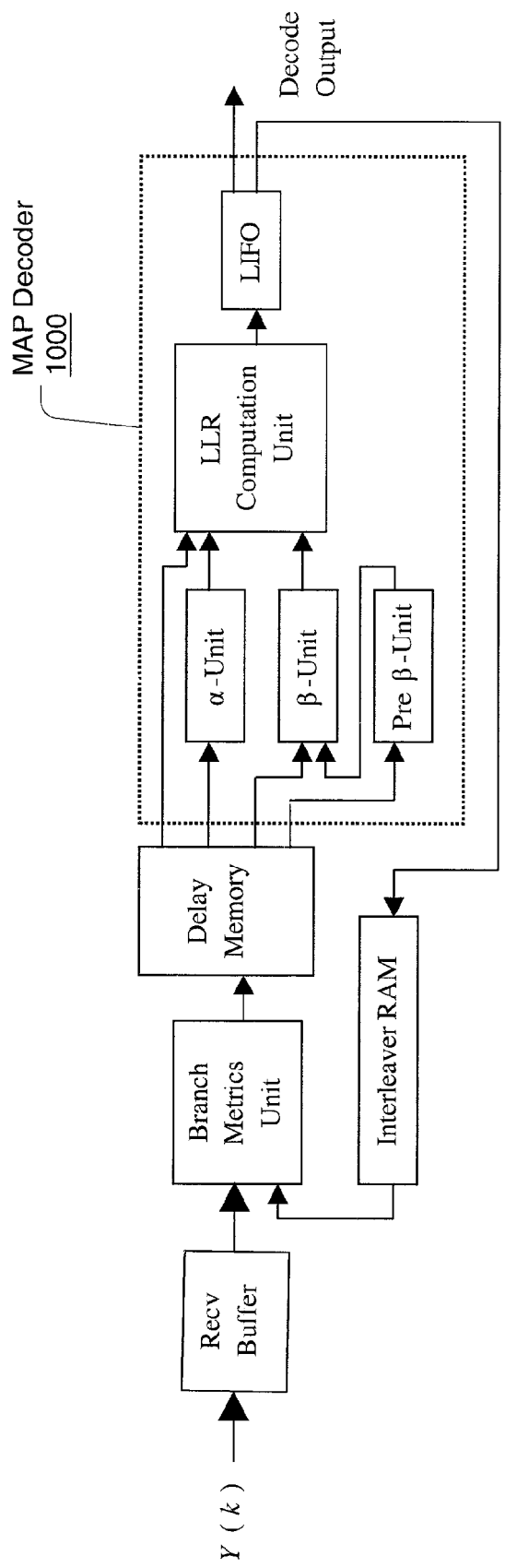
FIG. 10 is a block diagram of a Turbo decoder in accordance with one embodiment of the present invention.

An algorithm-specific kernel-block can be used as a Turbo decoder, an example of which is illustrated in FIG. 10. In this embodiment, the sliding window algorithm is adopted in order to avoid use of large amount of memory to store the state metrics α and β and the branch metrics γ of an entire block. The architecture as shown in FIG. 10 is known as the serial decoding architecture, which is well known. Other Turbo Decoder architectures can be used as well. A description of some Turbo encoding and decoding algorithms including MAP-algorithms and log-MAX algorithms is found in "Turbo Codes: Principles and Applications," by Vucetic and Yuan, Kluwer Academic Publishers, 2000.

Figure 11:
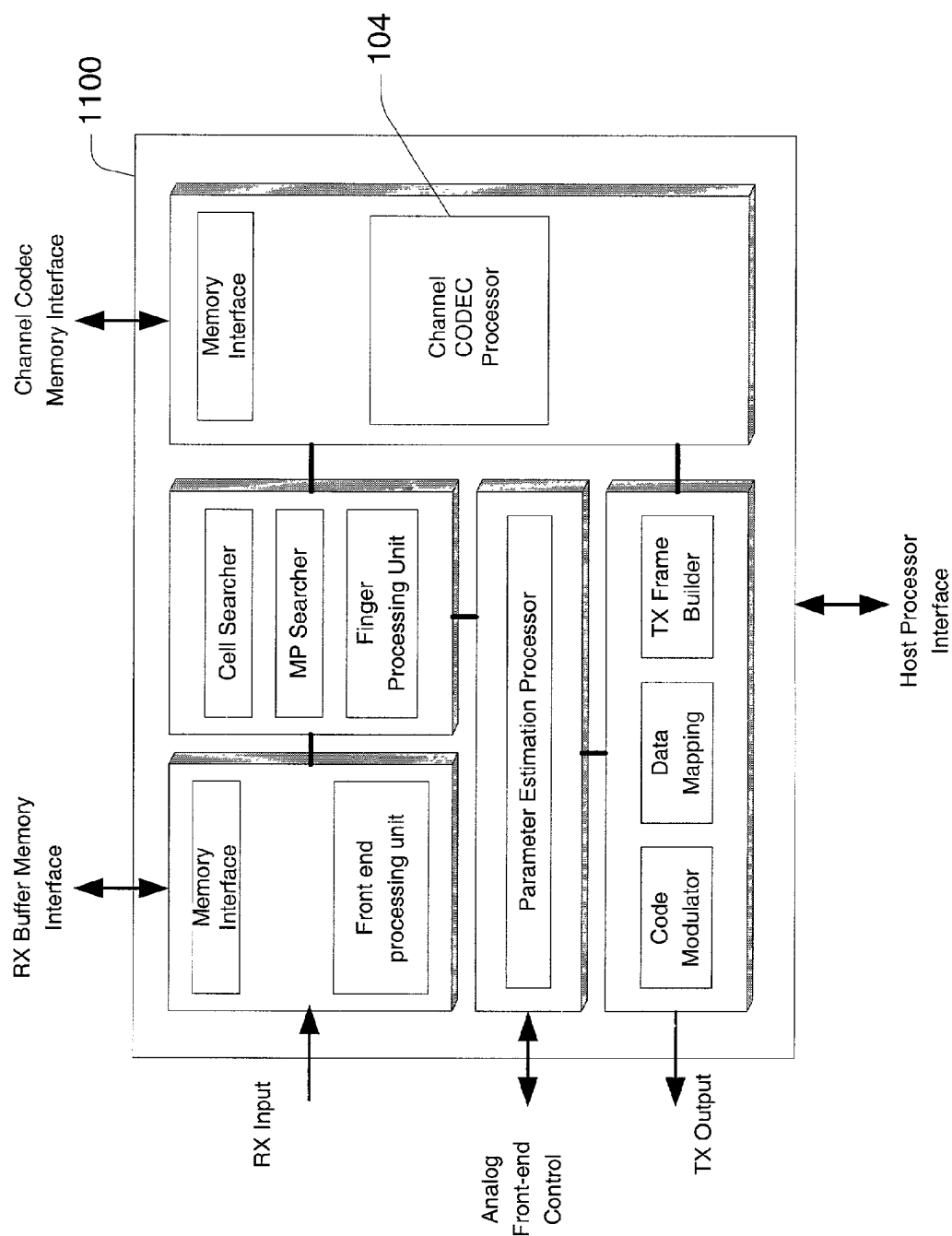
FIG. 11 is a block diagram of an electronic communication device having an integrated channel CODEC processor in accordance with another embodiment of the present invention.

Attention now turns to FIG. 11, which is block diagram of a single chip mobile electronic communication device 1100 in which a channel CODEC processor 104 according to the present invention can be integrated. The single chip mobile electronic communication device 1100, like any typical digital receiver and transmitter, conceptually includes a modem section and a CODEC section. The modem section of the device 1100 contains all the circuits and algorithms to construct and receive the baseband waveforms for a wide range of spread Spectrum Communication Standards such as 3GPP/FDD and cdma2000. The CODEC functions of the device 1100 are performed by the channel CODEC processor 104.

Preferred embodiments of the present invention and the best modes of carrying out the invention have thus been disclosed. The foregoing description, for purposes of explanation, used specific nomenclature to provide a thorough understanding of the invention. However, it will be apparent to one skilled in the art that the specific details are not required in order to practice the invention. In other instances, well known devices are shown in block diagram form in order to avoid unnecessary distraction from the underlying invention. The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A channel CODEC processor, comprising:
   an algorithm-specific kernel block operable to receive a data stream, the kernel block comprising logic tailored to perform at least one step of a channel CODEC algorithm on the data stream; and
   a processor core coupled to provide configuration data to the algorithm-specific kernel block, the configuration data causing the kernel block to perform the at least one step of the channel CODEC algorithm according to one of a plurality of wireless communication standards as specified by the configuration data.

2. The channel CODEC processor of claim 1, further comprising an interconnect through which data flows between the processor core and the algorithm-specific kernel block, wherein the processor core is operable to provide configuration data to the interconnect to control data-flow between the processor core and the algorithm-specific kernel block.

3. The channel CODEC processor of claim 1, wherein the configuration data controls operation parameters of the algorithm-specific kernel block.

4. The channel CODEC processor of claim 1, wherein the processor core is operable to perform time-multiplexed operations for a plurality of concurrent channel CODEC tasks.

5. The channel CODEC processor of claim 1, wherein the processor core is operable to perform another step of the channel CODEC algorithm.

6. The channel CODEC processor of claim 1, wherein the processor core is operable to perform steps of another channel CODEC algorithm.

7. The channel CODEC processor of claim 1, further comprising a local memory coupled to the processor core.

8. The channel CODEC processor of claim 1, further comprising a local memory coupled to the algorithm-specific kernel block.

9. The channel CODEC processor of claim 1, wherein the logic of the algorithm-specific kernel block is tailored to decode data in the data stream according to a Viterbi decoding algorithm.

10. The channel CODEC processor of claim 1, wherein the logic of the algorithm-specific kernel block is tailored to decode data in the data stream according to a convolutional decoding algorithm.

11. The channel CODEC processor of claim 1, wherein the logic of the algorithm-specific kernel block is tailored to decode data in the data stream according to a Turbo decoding algorithm.

12. The channel CODEC processor of claim 1, wherein the algorithm-specific kernel block comprises a reconfigurable encoder for convolutional codes in which at least one polynomial parameter of the encoder is controlled by the configuration data.

13. The channel CODEC processor of claim 1, wherein the algorithm-specific kernel block comprises a reconfigurable encoder for Turbo codes in which at least one polynomial parameter of the encoder is controlled by the configuration data.

14. The channel CODEC processor of claim 1, wherein the algorithm-specific kernel block comprises a reconfigurable cyclic-redundancy check (CRC) encoder.

15. The channel CODEC processor of claim 1, wherein the algorithm-specific kernel block comprises a reconfigurable cyclic-redundancy check (CRC) checker.

16. A channel CODEC processor, comprising:
a first algorithm-specific kernel block operable to receive a data stream, the first algorithm-specific kernel block comprising logic tailored to perform a step of a first channel CODEC algorithm on the data stream to generate a first processed data stream;
a second algorithm-specific kernel block coupled to the first algorithm-specific kernel block to receive the first processed data stream, the second algorithm-specific kernel block comprising logic tailored to perform a step of a second channel CODEC algorithm on the first processed data stream to generate a second processed data stream; and
a processor core coupled to provide configuration data to the algorithm-specific kernel blocks, the configuration data causing the algorithm-specific kernel blocks to perform the step of the first channel CODEC algorithm and the step of the second channel CODEC algorithm according to one of a plurality of wireless communication standards as specified by the configuration data.

17. channel CODEC processor of claim 16, further comprising an interconnect through which data flows among the processor core and the algorithm-specific kernel blocks, wherein the processor core is operable to provide configuration data to the interconnect to control data-flow among the processor core and the algorithm-specific kernel blocks.

18. The channel CODEC processor of claim 16, wherein the first configuration data controls operation parameters of the first algorithm-specific kernel block and wherein the second configuration data controls operation parameters of the second algorithm-specific kernel block.

19. The channel CODEC processor of claim 16, wherein the processor core is operable to perform time-multiplexed operations for a plurality of concurrent channel CODEC tasks.

20. The channel CODEC processor of claim 16, wherein the processor core is operable to perform steps of the first channel CODEC algorithm and the second channel CODEC algorithm.

21. The channel CODEC processor of claim 16, wherein the processor core is operable to perform steps of a third channel CODEC algorithm.

22. A channel CODEC processor, comprising:
an input operable to receive a data stream;
a plurality of processor cores including a first processor core and a second processor core operable to process data in the data stream;
a plurality of algorithm-specific kernel blocks including a first algorithm-specific kernel block and a second algorithm-specific kernel block coupled to the first processor core and the second processor core, respectively, wherein the first algorithm-specific kernel block is operable to receive first data from the first processor core and to perform at least one step of a first channel CODEC algorithm on the first data, wherein the second algorithm-specific kernel block is operable to receive second data from the second processor core and to perform at least one step of a second channel CODEC algorithm on the second data.

23. The channel CODEC processor of claim 22 wherein operation parameters of the first algorithm-specific kernel block and the second algorithm-specific kernel block are user-configurable.

24. The channel CODEC processor of claim 22 wherein at least one of the processor cores is coupled to provide configuration data to the algorithm-specific kernel blocks, the configuration data causing the algorithm-specific kernel blocks to perform the step of the first channel CODEC algorithm and the step of the second channel CODEC algorithm according to one of a plurality of wireless communication standards as specified by the configuration data.

25. The channel CODEC processor of claim 22, further comprising an interconnect through which data flows among the processor cores and the algorithm-specific kernel blocks, wherein at least one of the processor cores is operable to provide configuration data to the interconnect to control data-flow between the processor cores and the algorithm-specific kernel blocks.

26. The channel CODEC processor of claim 22, wherein the processor cores are operable to perform time-multiplexed operations for a plurality of concurrent channel CODEC tasks.

27. The channel CODEC processor of claim 22, further comprising memories coupled to the processor cores.

28. The channel CODEC processor of claim 22, further comprising memories coupled to the algorithm-specific kernel blocks.

29. A communication device, comprising:
an I/O interface operable to couple to an antenna;
a modem device for modulating and demodulating data coupled to the I/O interface; and
a channel CODEC processor coupled to the modem device to receive a demodulated data stream, the channel CODEC processor comprising:
a first algorithm-specific kernel block operable to receive the demodulated data stream, the kernel block comprising logic tailored to perform at least one step of a channel decoding algorithm on the demodulated data stream; and
a first processor core coupled to provide first configuration data to the algorithm-specific kernel block, the configuration data causing the kernel block to perform the at least one step of the channel decoding algorithm according to one of a plurality of wireless communication standards as specified by the first configuration data.

30. The channel CODEC processor of claim 29, wherein the first processor core is operable to perform steps of the channel decoding algorithm.

31. The communication device of claim 29, further comprising a network interface operable to receive a data stream from a network, and wherein the channel CODEC processor further comprises:
a second algorithm-specific kernel block operable to receive the data stream, the kernel block comprising logic tailored to perform at least one step of a channel encoding algorithm on the data stream;
a second processor core coupled to provide second configuration data to the algorithm-specific kernel block, the configuration data causing the kernel block to perform the at least one step of the channel encoding algorithm according to one of a plurality of wireless communication standards as specified by the second configuration data.

32. The communication device of claim 31, wherein the second processor core is operable to perform steps of the channel decoding algorithm.

33. A communication device, comprising:
an I/O interface operable to couple to an antenna;
a modem device for modulating and demodulating data coupled to the I/O interface; and
a channel CODEC processor coupled to the modem device to receive a demodulated data stream, the channel CODEC processor comprising:
  a first algorithm-specific kernel block operable to receive the demodulated data stream, the first algorithm-specific kernel block comprising logic tailored to perform a step of a first channel decoding algorithm on the demodulated data stream to generate a first processed data stream;
  a second algorithm-specific kernel block coupled to the first algorithm-specific kernel block to receive the first processed data stream, the second algorithm-specific kernel block comprising logic tailored to perform a step of a second channel decoding algorithm on the first processed data stream to generate a second processed data stream; and
  a first processor core coupled to provide first configuration data to the algorithm-specific kernel blocks, the configuration data causing the algorithm-specific kernel blocks to perform the step of the first channel decoding algorithm and the step of the second channel decoding algorithm according to one of a plurality of wireless communication standards as specified by the first configuration data.

34. The communication device of claim 33, wherein the first processor core is operable to perform steps of the channel decoding algorithms.

35. The communication device of claim 33, further comprising a network interface operable to receive a data stream from a network.

36. The communication device of claim 35, wherein the channel CODEC processor further comprises:
  a third algorithm-specific kernel block operable to receive the data stream from the network interface, the third algorithm-specific kernel block comprising logic tailored to perform a step of a first channel encoding algorithm on the data stream to generate a third processed data stream;
  a fourth algorithm-specific kernel block coupled to the third algorithm-specific kernel block to receive the third processed data stream, the fourth algorithm-specific kernel block comprising logic tailored to perform a step of a second channel encoding algorithm on the first processed data stream to generate a fourth processed data stream; and
  a second processor core coupled to provide second configuration data to the algorithm-specific kernel blocks, the configuration data causing the algorithm-specific kernel blocks to perform the step of the first channel encoding algorithm and the step of the second channel encoding algorithm according to one of a plurality of wireless communication standards as specified by the second configuration data.

37. The communication device of claim 36, wherein the second processor core is operable to perform steps of the channel encoding algorithms.

* * * * *

UNITED STATES PATENT AND TRADEMARK OFFICE
CERTIFICATE OF CORRECTION

PATENT NO. : 7,230,978 B2
APPLICATION NO. : 10/040727
DATED : June 12, 2007
INVENTOR(S) : Stefan J. Bitterlich et al.

It is certified that error appears in the above-identified patent and that said Letters Patent is hereby corrected as shown below:

In the Specification:

Col. 2: line 8, "cores" should read --core--;

Col. 4: line 10, "100$a$" should read --110$a$--;

line 40, delete "and";

Col. 6: line 29, "kernels is" should read --kernels are--;

line 67, "configures" should read --they can configure--;

Col. 8: line 51, "coefficient" should read --coefficients--;

line 52, "is" should read --as--;

line 64, "us" should read --is--

Col. 9: line 3, "number" should read --numbers--;

line 21, "has fixed" should read --has a fixed--;

line 58, "EEE" should read --IEEE--

"utilizes" should read --utilized--;

Col. 17: line 41, "amount" should read --amounts--;

UNITED STATES PATENT AND TRADEMARK OFFICE
CERTIFICATE OF CORRECTION

PATENT NO. : 7,230,978 B2
APPLICATION NO. : 10/040727
DATED : June 12, 2007
INVENTOR(S) : Stefan J. Bitterlich et al.

It is certified that error appears in the above-identified patent and that said Letters Patent is hereby corrected as shown below:

In the Claims:

In Claim 17, line 35, "channel" should read --The channel--

Signed and Sealed this

Seventh Day of August, 2007

JON W. DUDAS
*Director of the United States Patent and Trademark Office*